United States Patent
Wang et al.

(10) Patent No.: US 7,440,247 B2
(45) Date of Patent: Oct. 21, 2008

(54) GATE COUPLING ELECTROSTATIC DISCHARGE PROTECTION CIRCUIT WITH REDUNDANT STRUCTURES

(75) Inventors: Joe Wang, Taipei (TW); Yung-Chi Sung, Taipei (TW)

(73) Assignee: VIA Technologies, Inc., Taipei (TW)

( * ) Notice: Subject to any disclaimer, the term of this patent is extended or adjusted under 35 U.S.C. 154(b) by 346 days.

(21) Appl. No.: 11/059,517

(22) Filed: Feb. 17, 2005

(65) Prior Publication Data
US 2005/0194644 A1     Sep. 8, 2005

(30) Foreign Application Priority Data
Feb. 19, 2004    (TW)    .............................. 93104156 A

(51) Int. Cl.
*H02H 9/00*    (2006.01)
*H02H 3/20*    (2006.01)
*H02H 3/22*    (2006.01)
*H02H 9/04*    (2006.01)
*H02H 1/00*    (2006.01)
*H02H 1/04*    (2006.01)
*H02H 9/06*    (2006.01)
*H01C 7/12*    (2006.01)

(52) U.S. Cl. .................. 361/56; 361/91.1; 361/111; 361/118

(58) Field of Classification Search .................. 361/56, 361/91.1, 111, 118
See application file for complete search history.

(56) References Cited

U.S. PATENT DOCUMENTS 5,579,200 A * 11/1996 Rajkanan et al. ............ 361/111
6,097,071 A *  8/2000 Krakauer ..................... 257/395

FOREIGN PATENT DOCUMENTS

CN          1385902 A       12/2002

* cited by examiner

*Primary Examiner*—Michael J Sherry
*Assistant Examiner*—Dharti H Patel
(74) *Attorney, Agent, or Firm*—Birch, Stewart, Kolasch & Birch, LLP

(57) ABSTRACT

A gate coupling electrostatic discharge protection circuit is disclosed. The protection circuit that is connected an ESD structure with gate coupling to a first level circuit and other ESD structures with gate coupling to a derived circuit derived from the first level circuit in parallel could be used to drain the electrostatic discharge. The resistance of the first level circuit and the resistance of derived circuit are matched in draining the electrostatic discharge, whereby the current wouldn't concentrate on a certain portion of these cascades structures.

23 Claims, 4 Drawing Sheets

GATE COUPLING ELECTROSTATIC DISCHARGE PROTECTION CIRCUIT WITH REDUNDANT STRUCTURES

BACKGROUND OF THE INVENTION

1. Field of the Invention

The present invention generally relates to a circuit design, and more particularly to an electrostatic discharge protection circuit.

2. Description of the Prior Art

For some reasons, for instance, to save layout area and to enlarge parasitic capacitance, result in serious problem of electrostatic discharges (ESD) in the fabrication process. With the progress of the process, the effects of electrostatic discharges are more serious than before. Moreover, the reliability of circuits may be damaged because of electrostatic discharge. For examples, the gate oxide has to become thinner for saving the area or for suiting the characteristic of the components. Then, the LDD structure may be used for resolving the hot-carrier effect problem. The progress technique for saving the area causes the electrostatic discharge protection down, thereby the damage caused by electrostatic discharge increases. More particularly, the thinner the gate oxide is made, the lower the trigger voltage of the oxide is. Thus, how to efficiently drain electrostatic discharge for avoiding the gate suffering damage will be a very important concern.

Referring to FIG. 1A, a gated grounded N-P structure may be used to be an electrostatic discharge protection circuit. The gate oxide of the simple CMOS structure is often damaged by high voltage and the circuit could be unreliable. Thus, a cascade structure, referring to FIG. 1B, two cascade N-MOS, is often used to be an electrostatic discharge protection component in a tolerant I/O circuit to resolve such a problem.

Such an ESD protection component applies the characteristic of "Zener breakdown" of the potential NPN bipolar to drain ESD. The gated grounded N-P structure also has a potential NPN bipolar with a shorter length of the base, because its base is coupled with the ground. Comparing with them, the potential NPN bipolar in the cascade structure has the longer length of the base because of the two cascade N-MOS. The longer base means that it is harder to turn on the potential NPN bipolar. It also means the trigger voltage is higher and the ability for ESD protection decreases. The conventional ESD protection circuit applies the ESD drain circuit to drain ESD, so there are many different designs of the ESD protection circuit, such as N-P structure and cascade structure. Furthermore, ESD protection circuit also needs extra designs to ensure that the ESD is drain toward substrate. It avoids too much current being collected on the surface to cause locally over heat or component damaged.

Accordingly, applying only one ESD drain circuit to drain ESD may suffer the damage by the unexpected current over the predetermined design. But, to strengthen the ESD drain circuit for the problem will cause the ability for ESD protection down. Thus another design, referring to FIG. 1C, applies two parallel ESD drain circuit to share the current. FIG. 1C illustrates the cascade structure to be the ESD protection circuit. The ESD protection circuit can also be the N-P structure and so on. The parallel cascade structures are structured by 4 N-MOS with gate pads A, B, C and D. In this regard, gate pads B and D are electrically coupled with a first level circuit and a resistance E respectively. With the effect of coupling, the amounts of voltage in B and D will be different. Thus, the resistance of the first level circuit and resistance E should match, and thereby the ESD won't be centralized in a single cascade structure to cause locally over heat or component damaged. The foregoing problem does not only happen in the cascade structure, but also other ESD drain circuit.

It is very hard to accurately evaluate the resistance of the first level circuit, and thereby the resistance of E is hard to be matched, whereby the time to drain ESD in each of the parallel ESD drain circuits will be different. Thus ESD may centralize in one ESD drain circuit. However, it is impossible to change resistance E after the circuit is fabricated. For adjusting the resistance, referring to FIG. 1D, an N-MOS can be added for controlling the resistance of E. Such a design makes some improvement, but it still can not accurately evaluate the resistance. Because the resistance of the first level circuit coupled with gate pad B may change with the environment, the resistance E shown in FIG. 1C and the N-MOS shown in FIG. 1D can not completely resolve the foregoing problems. Therefore how to equalize the current to each ESD protection circuit is the key resolve ESD.

SUMMARY OF THE INVENTION

One main purpose of the present invention is to provide an ESD protection circuit to prevent the ESD to damage component.

Another main purpose of the present invention is to provide solution to avoid the current not being equalized to drain in each ESD protection, in which the current will centralize in some ESD protection circuits.

Accordingly, the present invention provides a gate coupled ESD protection circuit. The ESD protection circuit contains a gate coupled cascade structure electrically coupled with a first level circuit and other gate coupled cascade structure electrically coupled with a separated redundant circuit derived from the first level circuit to drain ESD. Each resistance of all gate coupled cascade structure matches to each other when the first level circuit and the redundant circuits drain the ESD.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will became apparent to those skilled in the art from This detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

Some appropriate and preferred embodiments of the present invention will now be described in the following. It should be noted, however, that the embodiment is merely an example and can be variously modified without departing from the range of the present invention.

It is to be understood, however, that the drawings, which are not to scale, are designed for the purpose of illustration and not as a definition of the limits of the invention, for which reference should be made to the appended claims.

In the prior art, ESD is drained to the ground by ESD protection circuit. The ESD protection circuit may be formed by an ESD drain circuit electrically coupled with a first level circuit and other ESD drain circuits electrically coupled with a separated resistance, the current tends to centralize in part of the ESD drain circuits if the resistance of the first level circuit and the redundant circuits do not match. The resistance of each separated resistance is evaluated from the first level circuit, thus the resistance mismatched problem happens because of the inaccurately evaluation or the change of the temperature.

Accordingly, the separated resistance is replaced by a redundant circuit derived from the first level circuit. Namely, the ESD drain circuits except the one electrically coupled with the first level circuit is electrically coupled with the redundant circuit. The redundant circuit can be a copy of the first level circuit or other structure derived from the first level circuit. As long as the resistance of the redundant circuit matches the resistance of the first level circuit when the voltage of the ESD protection circuits contains at the holding voltage, the structure of the redundant circuit is not limited in the present invention. In other words, the redundant circuit matches the first level circuit, so each ESD protection circuit matches to each other and drains the ESD simultaneously. Therefore the damage caused by the ESD can be eliminated.

Figure 1A:
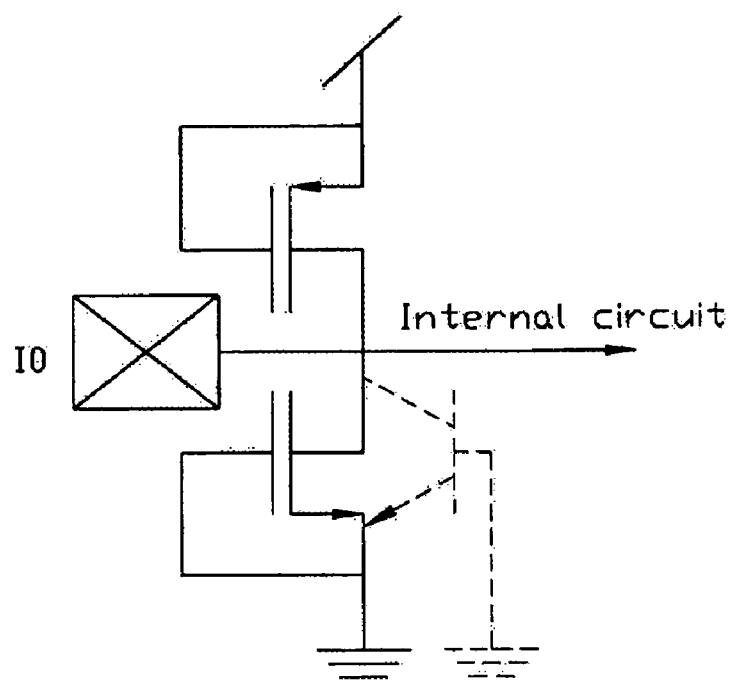
FIG. 1A through FIG. 1D are the diagrams of the prior art.
Figure 1B:
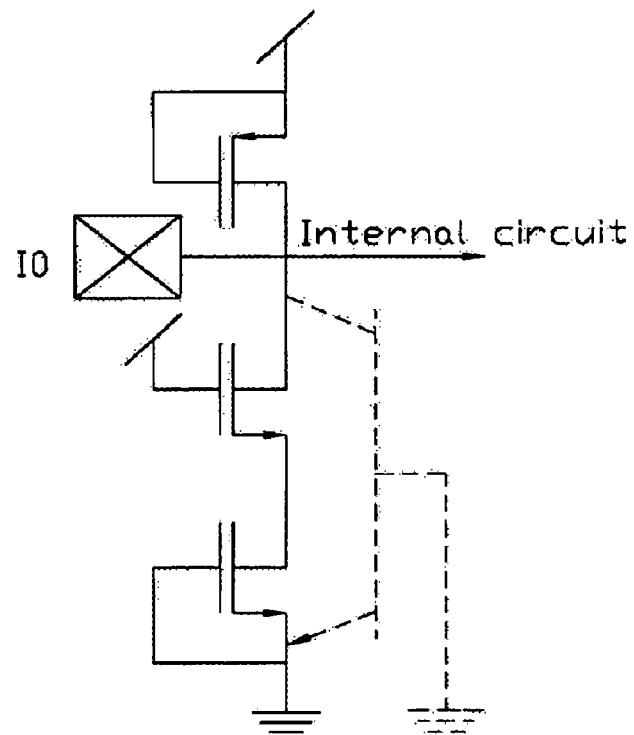
Figure 1C:
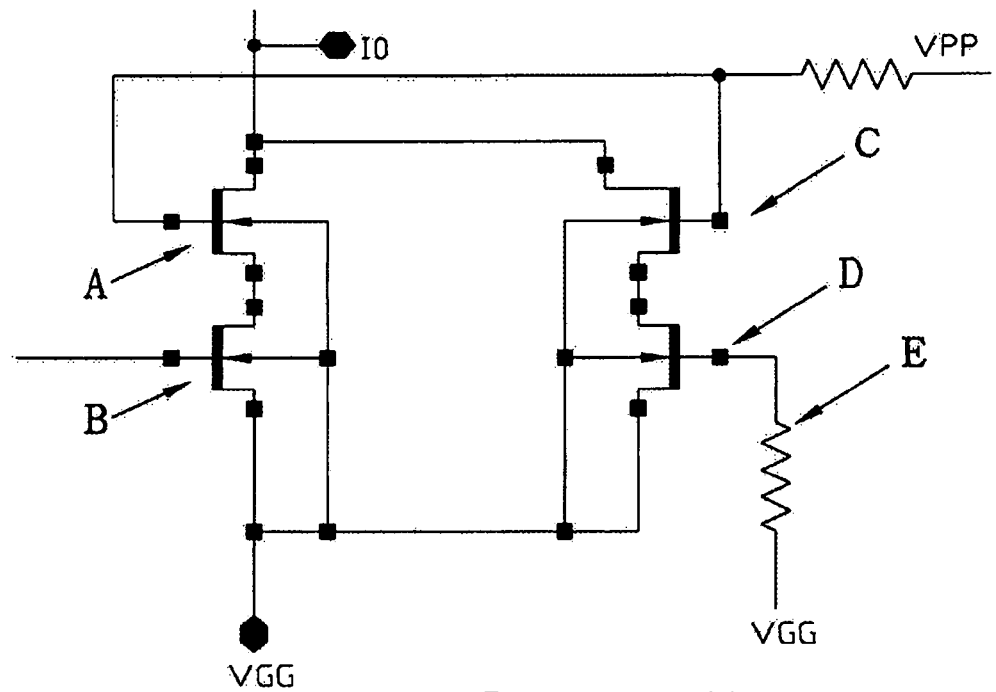
Figure 1D:
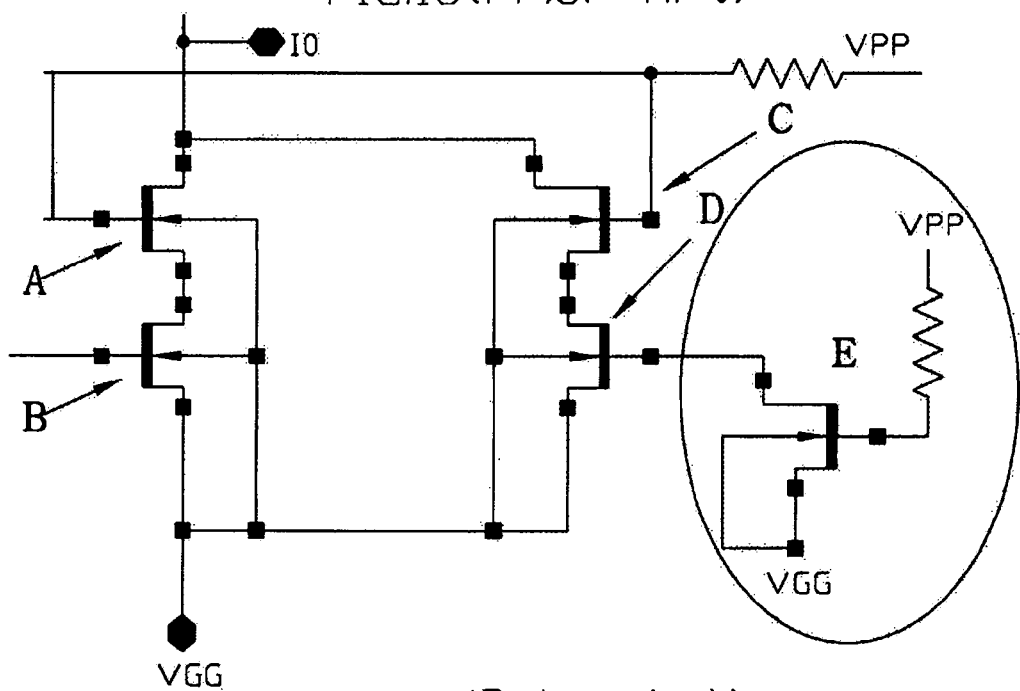
Figure 2:
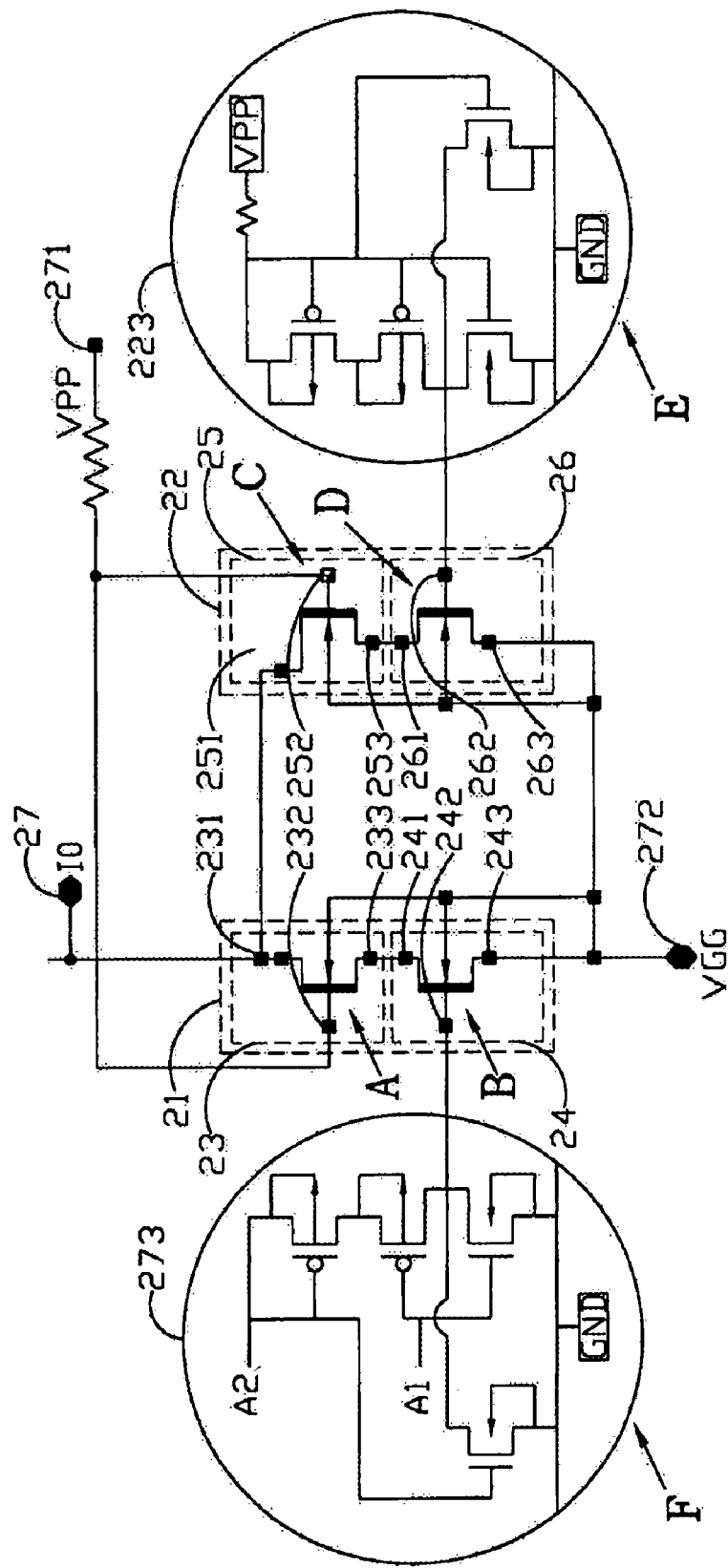
FIG. 2 is the diagram of one embodiment of the present invention.

Therefore, one embodiment of the present invention is a gate coupling electrostatic discharge protection circuit with redundant structure, in which applies a plurality of ESD drain circuits to drain ESD simultaneously. The embodiment illustrates the gate coupled cascade structure to be ESD drain circuit for clearly describing the present invention and not using for limiting the embodiment. The embodiment can apply other structure of ESD drain circuit, and the present invention does not limit it. Referring to FIG. 2, the embodiment includes a first cascade structure 21 and a second cascade structure 22. The first cascade structure 21 is constructed by cascading a first metal-oxide-semiconductor (MOS) 23 and a second metal-oxide-semiconductor 24, wherein the first source 233 of the first metal-oxide-semiconductor 23 is coupled with the second drain 241 of the second metal-oxide-semiconductor 24. Therefore a potential bipolar is formed to use the first drain 231 of the first metal-oxide-semiconductor 23 and the second source 243 of the second metal-oxide-semiconductor 24 to be its drain and source respectively. Besides, the first gate 232 of the first metal-oxide-semiconductor 23 and the second gate 242 of the second metal-oxide-semiconductor 24 are electrically coupled with a power source 271 and a first level circuit 273. The first level circuit 273 may have one or more pads, such as A1 or A2, electrically coupled with the other circuit. Moreover, the first drain 231 and the second source 243 are electrically coupled with a circuit 27 and the ground 272. Therefore a first sharing turn-on area is formed between the first source 233 and the second drain 241. The length of the first sharing turn-on area identifies the first trigger voltage and the first holding voltage of the first cascade structure 21. When the voltage on the first drain 231 reaches the first trigger voltage, the current will be drain through the first cascade structure 21 and the voltage will be decreased and contained to the first holding voltage.

The second cascade structure 22 is constructed by cascading a third metal-oxide-semiconductor (MOS) 25 and a fourth metal-oxide-semiconductor 26, wherein the third source 253 of the third metal-oxide-semiconductor 25 is coupled with the fourth drain 261 of the fourth metal-oxide-semiconductor 26. Therefore a potential bipolar is formed to use the third drain 251 of the third metal-oxide-semiconductor 25 and the fourth source 263 of the fourth metal-oxide-semiconductor 26 to be its drain and source respectively. Besides, the third gate 252 of the third metal-oxide-semiconductor 25 and the fourth gate 262 of the fourth metal-oxide-semiconductor 26 are electrically coupled with the power source 271 and a redundant circuit 223. Moreover, the third drain 251 and the fourth source 263 are electrically coupled with the circuit 27 and the ground 272. Therefore a second sharing turn-on area is formed between the third source 253 and the fourth drain 261. The length of the second sharing turn-on area identifies the second trigger voltage and the second holding voltage of the second cascade structure 22. When the voltage on the third drain 251 reaches the second trigger voltage, the current will be drain through the second cascade structure 22 and the voltage will be decreased and contained to the second holding voltage.

Figure 3:
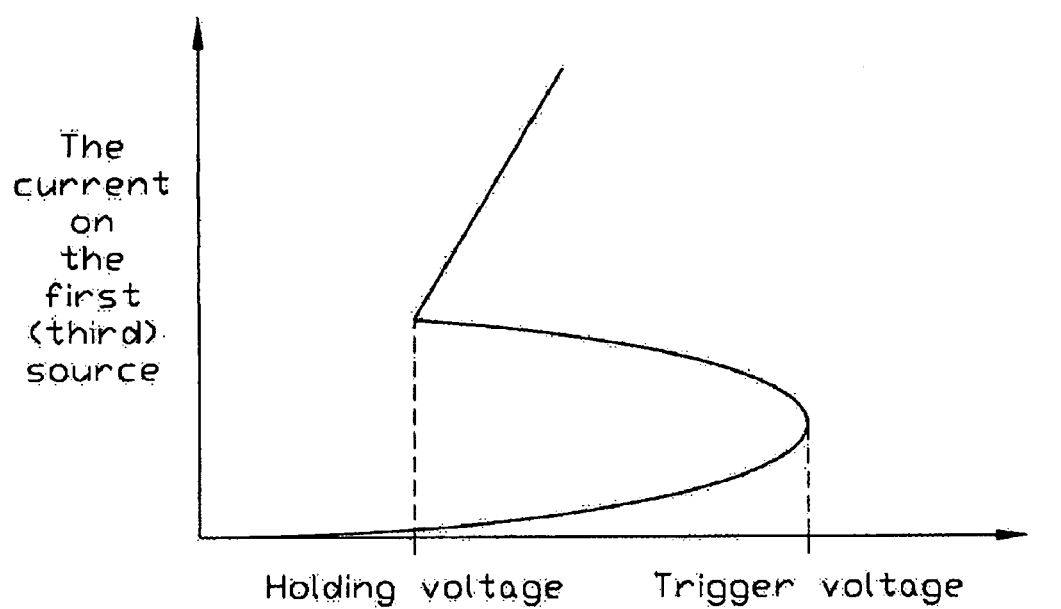
FIG. 3 is the diagrams of current and voltage of the embodiment.

Therefore, the first cascade structure 21 and the second cascade structure 22 match to each other and has the same trigger voltage (The first trigger voltage equals the second trigger voltage.) and the same holding voltage (The first trigger voltage equals the second holding voltage). Thus the trigger voltage and the holding voltage can be considered as the trigger voltage and the holding voltage of the ESD protection circuit. Referring to FIG. 3, a current of other power sources except the power source 271 can be found when the voltage on the circuit 27 reaches the trigger voltage. Then the current of the other power sources is drained to the ground 272 via the first cascade structure 21 and the second cascade structure 22 simultaneously, thereby the voltage is decreased and contained at the holding voltage. Because the resistance of the first level circuit electrically coupled with the first cascade structure 21 and the resistance of the redundant circuit electrically coupled with the second cascade structure 22 matches to each other, both of the time to drain ESD also matches to each other. By way of this, the current is equalized to each cascade structure and the problem of current centralization can be avoided.

Furthermore, the foregoing metal-oxide-semiconductors can be N-MOS or P-MOS, the present invention does not limit to the type of metal-oxide-semiconductors. Moreover, the above-mentioned circuit 27 can be other internal circuits or input/output (IO) circuit. Namely, the first level circuit 273 electrically coupled with the second gate 242 is an internal circuit and the circuit 27 electrically coupled with the first drain 231 and the third drain 251 can be an IO circuit. The gate coupled ESD protection circuit is mainly used for identifying the low voltage below the trigger voltage and the ESD above the trigger voltage before draining the ESD. Accordingly, the gate coupled ESD protection circuit can further drain the ESD.

Accordingly, the present invention does not only have a plurality of ESD drain circuits for simultaneously draining the current of high voltage (ESD), but also the time for draining ESD in each ESD drain circuit matches to each other. Besides, the resistance evaluation of the protection circuit and the complex designs in the prior art can be ignored. A simply way is designed to copy or to copy with a little modified the first level circuit, the current can be equalized to each ESD drain circuit.

What are described above are only preferred embodiments of the invention, not for confining the claims of the invention; and for those who are familiar with the present technical field, the description above can be understood and put into practice, therefore any equal-effect variations or modifications made within the spirit disclosed by the invention should be included in the appended claims.

What is claimed is:

1. A gate coupling electrostatic discharge protection circuit with redundant structure, comprising:
   a first cascade structure, having:
   a first metal-oxide-semiconductor, having a first source, a first drain electrically coupled with a circuit to be protected from electrostatic discharge such that the electrostatic discharge is drained from the circuit through the first drain, and a first gate electrically coupled with a power source; and
   a second metal-oxide-semiconductor, having a second source electrically coupled with a ground of said circuit, a second drain electrically coupled with said first source and a second gate electrically coupled with a first level circuit which has at least one metal-oxide-semiconductor; and
   at least a second cascade structure, having:
   a third metal-oxide-semiconductor, comprising a third source, a third drain electrically coupled with said circuit to be protected from electrostatic discharge such that the electrostatic discharge is drained from the circuit through the third drain, and a third gate electrically coupled with said power source;
   a fourth metal-oxide-semiconductor, having a fourth source electrically coupled with said ground of said circuit, a fourth drain electrically coupled with said third source and a fourth gate electrically coupled with a redundant circuit derived from said first level circuit,
   wherein the resistance of said redundant circuit and said first level circuit matches when said electrostatic discharge is drained to said ground via said first cascade structure and said second cascade structure simultaneously.

2. The gate coupling electrostatic discharge protection circuit with redundant structure according to claim 1, wherein the distance between said first source and said second drain controls a first trigger voltage and a first holding voltage.

3. The gate coupling electrostatic discharge protection circuit with redundant structure according to claim 1, wherein said electrostatic discharge is drained from said first cascade structure and said second cascade structure to said ground of said circuit simultaneously.

4. The gate coupling electrostatic discharge protection circuit with redundant structure according to claim 1, wherein said redundant circuit is a copy of said first level circuit, such that bias to the second gate and bias to the fourth gate are substantially the same.

5. A gate coupling electrostatic discharge protection circuit with redundant structure, comprising:
   a first cascade structure, having:
   a first metal-oxide-semiconductor, having a first source, a first drain electrically coupled with a circuit to be protected from electrostatic discharge such that the electrostatic discharge is drained from the circuit through the first drain, and a first gate electrically coupled with a power source, wherein the voltage of said power source is lower than a trigger voltage;
   a second metal-oxide-semiconductor, having a second source electrically coupled with a ground of said circuit, a second drain and a second gate electrically coupled with a first level circuit which has at least one metal-oxide-semiconductor; and
   a first sharing turn-on area electrically coupled with said first source and said second drain, wherein said first metal-oxide-semiconductor and said second metal-oxide-semiconductor are used to be the source and the drain of said first sharing turn-on area; and
   at least a second cascade structure, having:
   a third metal-oxide-semiconductor, having a third source, a third drain electrically coupled with said circuit to be protected from electrostatic discharge such that the electrostatic discharge is drained from the circuit through the third drain, and a third gate electrically coupled with said power source;
   a fourth metal-oxide-semiconductor, having a fourth source electrically coupled with said ground of said circuit, a fourth drain and a fourth gate electrically coupled with a redundant circuit derived from said first level circuit;
   a second sharing turn-on area electrically coupled with said third source and said fourth drain, wherein said third metal-oxide-semiconductor and said fourth metal-oxide-semiconductor are used to be the source and the drain of said second sharing turn-on area,
   wherein the resistance of said redundant circuit and said first level circuit matches when said electrostatic discharge is drained to said ground via said first cascade structure and said second cascade structure simultaneously.

6. The gate coupling electrostatic discharge protection circuit with redundant structure according to claim 5, wherein the distance between said first source and said second drain controls a first trigger voltage and a first holding voltage.

7. The gate coupling electrostatic discharge protection circuit with redundant structure according to claim 5, wherein said electrostatic discharge is drained from said first cascade structure and said second cascade structure to said ground of said circuit simultaneously.

8. The gate coupling electrostatic discharge protection circuit with redundant structure according to claim 5, wherein said redundant circuit is a copy of said first level circuit, such that bias to the second gate and bias to the fourth gate are substantially the same.

9. The gate coupling electrostatic discharge protection circuit with redundant structure according to claim 5, wherein said redundant circuit is an equivalent circuit of said first level circuit.

10. A gate coupling electrostatic discharge protection circuit with redundant structure, comprising:
    a first electrostatic discharge drain circuit electrically coupled with a first level circuit which has at least one metal-oxide-semiconductor, wherein The first electrostatic discharge drain circuit has a first metal-oxide-semiconductor having a first drain electrically coupled with a circuit to be protected from electrostatic discharge such that the electrostatic discharge is drained from the circuit though the first drain; and
    a second electrostatic discharge drain circuit electrically coupled with said first electrostatic discharge drain circuit in parallel, wherein said second electrostatic discharge drain circuit is electrically coupled with a redundant circuit derived from said first level circuit, wherein The second electrostatic discharge drain circuit has a third metal-oxide-semiconductor having a third drain electrically coupled with the circuit to be protected from electrostatic discharge such that the electrostatic discharge is drained from the circuit though the third drains,
    wherein the resistance of said redundant circuit and said first level circuit matches when said electrostatic discharge is drained to said ground via said first electrostatic discharge drain circuit and said second electrostatic discharge drain circuit simultaneously.

11. The gate coupling electrostatic discharge protection circuit with redundant structure according to claim 10, wherein said first electrostatic discharge drain circuit has a first trigger voltage and a first holding voltage.

12. The gate coupling electrostatic discharge protection circuit with redundant structure according to claim 11, wherein said voltage on said first electrostatic discharge drain circuit is decreased and contained to said first holding voltage after said voltage on said first electrostatic discharge drain circuit increases to said first trigger voltage.

13. The gate coupling electrostatic discharge protection circuit with redundant structure according to claim 11, wherein said voltage on said first electro static discharge drain circuit increases to said first trigger voltage when said first electrostatic discharge drain circuit suffers electrostatic discharge.

14. The gate coupling electrostatic discharge protection circuit with redundant structure according to claim 11, wherein said second electrostatic discharge drain circuit has a second trigger voltage and a second holding voltage.

15. The gate coupling electrostatic discharge protection circuit wit redundant structure according to claim 14, wherein said voltage on said second electrostatic discharge drain circuit is decreased and contained to said second holding voltage after said voltage on said second electrostatic discharge drain circuit increases to said second trigger voltage.

16. The gate coupling electrostatic discharge protection circuit with redundant structure according to claim 14, wherein said voltage on said second electrostatic discharge drain circuit increases to said second trigger voltage when said second electrostatic discharge drain circuit suffers electrostatic discharge.

17. The gate coupling electrostatic discharge protection circuit with redundant structure according to claim 14, wherein said first holding voltage matches said second holding voltage.

18. The gate coupling electrostatic discharge protection circuit with redundant structure according to claim 10, wherein said electrostatic discharge is drained from said first electrostatic discharge drain circuit and said second electrostatic discharge drain circuit to said ground of said circuit simultaneously.

19. The gate coupling electrostatic discharge protection circuit with redundant structure according to claim 18, wherein the time for draining said electrostatic discharge via said first electrostatic discharge drain circuit matches the time for draining said electrostatic discharge via said second electrostatic discharge drain circuit.

20. The gate coupling electrostatic discharge protection circuit with redundant structure according to claim 10, wherein said redundant circuit is a copy of said first level circuit,
wherein the first electrostatic discharge drain circuit has a second metal-oxide-semiconductor having a second gate electrically coupled with the first level circuit, and the second electrostatic discharge drain circuit has a fourth metal-oxide-semiconductor having a fourth gate electrically coupled with the redundant circuit, such that bias to the second gate and bias to the fourth gate are substantially the same.

21. The gate coupling electrostatic discharge protection circuit with redundant structure according to claim 1, wherein the first gate is electrically connected to the power source via an external transistor, and the third gate is electrically connected to the power source via the external transistor.

22. The gate coupling electrostatic discharge protection circuit with redundant structure according to claim 5, wherein the first gate is electrically connected to the power source via an external transistor, and the third gate is electrically connected to the power source via the external transistor.

23. The gate coupling electrostatic discharge protection circuit with redundant structure according to claim 10, wherein the first gate is electrically connected to the power source via an external transistor, and the third gate is electrically connected to the power source via the external transistor.

* * * * *